(12) United States Patent　　　　(10) Patent No.:　US 12,601,900 B2

Liberman　　　　　　　　　　　　　(45) Date of Patent:　Apr. 14, 2026

(54) OPTICALLY CONCENTRATED THERMALLY STABILIZED PHOTOVOLTAIC SYSTEM AND METHOD

(71) Applicant: Green Capsula Solution Ltd., Hadera (IL)

(72) Inventor: Anastasia Liberman, Hadera (IL)

(73) Assignee: Green Capsula Solution Ltd., Hadera (IL)

( * ) Notice: Subject to any disclaimer, the term of this patent is extended or adjusted under 35 U.S.C. 154(b) by 0 days.

(21) Appl. No.: 19/120,514

(22) PCT Filed: Oct. 22, 2023

(86) PCT No.: PCT/IL2023/051092

§ 371 (c)(1),
(2) Date: Apr. 11, 2025

(87) PCT Pub. No.: WO2024/089686

PCT Pub. Date: May 2, 2024

(65) Prior Publication Data

US 2025/0264704 A1　　Aug. 21, 2025

(30) Foreign Application Priority Data

Oct. 23, 2022　(IL) ........................................ 297568

(51) Int. Cl.
*G02B 19/00*　　　(2006.01)
*H10K 30/40*　　　(2023.01)
(Continued)

(52) U.S. Cl.
CPC ..... *G02B 19/0019* (2013.01); *G02B 19/0042* (2013.01); *H10K 30/40* (2023.02); *H10K 30/865* (2023.02); *H10K 30/87* (2023.02)

(58) Field of Classification Search
CPC ............ G02B 19/0019; G02B 19/0042; H10K 30/40; H10K 30/865; H10K 30/87; F24S 23/80; F24S 70/14

See application file for complete search history.

(56) References Cited

U.S. PATENT DOCUMENTS 9,310,540 B2　　4/2016　Boonekamp et al.
10,210,999 B2　　2/2019　Alghamdi et al.
(Continued)

FOREIGN PATENT DOCUMENTS

DE　　　19609283 A1　　9/1997
EP　　　2693503 A1　　2/2014
(Continued)

OTHER PUBLICATIONS

Lashin ("Concentrated Photovoltaic/Thermal Hybrid System Coupled with a Thermoelectric Generator") Energies 2019, 12, 2623 (Year: 2019).*
(Continued)

*Primary Examiner* — Angelo Trivisonno
(74) *Attorney, Agent, or Firm* — Workman Nydegger

(57) ABSTRACT

Electrical energy generation system with an assembly comprising: a light concentrating funnel; a multilayer photovoltaic cell; a thermos-electric layer: and a thermal stabilization device, wherein each layer of the multilayer photovoltaic cell contains: 5 semiconductor nanoparticles complexed with perovskite, an electrolyte, and a catalyst. The system assembly is arranged so as light can enter at a range of incidence angles at the light concentrating funnel, is directed and concentrated, then exits the light concentrating funnel and irradiates the multilayer photovoltaic cell where a voltage is generated, and the residual heat from these processes is stabilized with a thermal stabilization device.

15 Claims, 4 Drawing Sheets

(51) Int. Cl.
   *H10K 30/80*      (2023.01)
   *H10K 30/87*      (2023.01)

(56) References Cited

U.S. PATENT DOCUMENTS

| | | |
|---|---|---|
| 2008/0023067 A1 | 1/2008 | Liangbing et al. |
| 2012/0006382 A1 | 1/2012 | Dagli et al. |
| 2015/0129034 A1 | 5/2015 | Snaith et al. |
| 2015/0200377 A1 | 7/2015 | Etgar et al. |
| 2021/0032108 A1 | 2/2021 | Lee et al. |
| 2021/0230480 A1 | 7/2021 | Sakai et al. |
| 2022/0302400 A1 | 9/2022 | Wheeler |

FOREIGN PATENT DOCUMENTS

| | | |
|---|---|---|
| JP | S59229136 A | 12/1984 |
| KR | 10-2101672 B1 | 4/2020 |
| WO | 2020/128955 A1 | 6/2020 |

OTHER PUBLICATIONS

International Preliminary Report on Patentability received for PCT application No. PCT/IL2023/051092, mailed on May 8, 2025, 6 pages.

International search Report and written opinion received for PCT application No. PCT/IL2023/051092, mailed on Dec. 28, 2023, 7 pages.

Ma, Weiguang et al., "Integrating Perovskite Photovoltaics and Noble-Metal-Free Catalysts toward Efficient Solar Energy Conversion and H2S Splitting", ACS Catalysis, Aug. 9, 2016, vol. 6, pp. 6198-6206.

Li, Yujiao et al., "Heterostructural perovskite solar cell constructed with Li-doped p. MAPbl3/n-TiO2 PN junction", Solar Energy, Aug. 31, 2021, vol. 226, pp. 446-454.

Extended European Search Report received for EP Patent Application No. 23882098.9, mailed on Jan. 16, 2026, 10 pages.

* cited by examiner

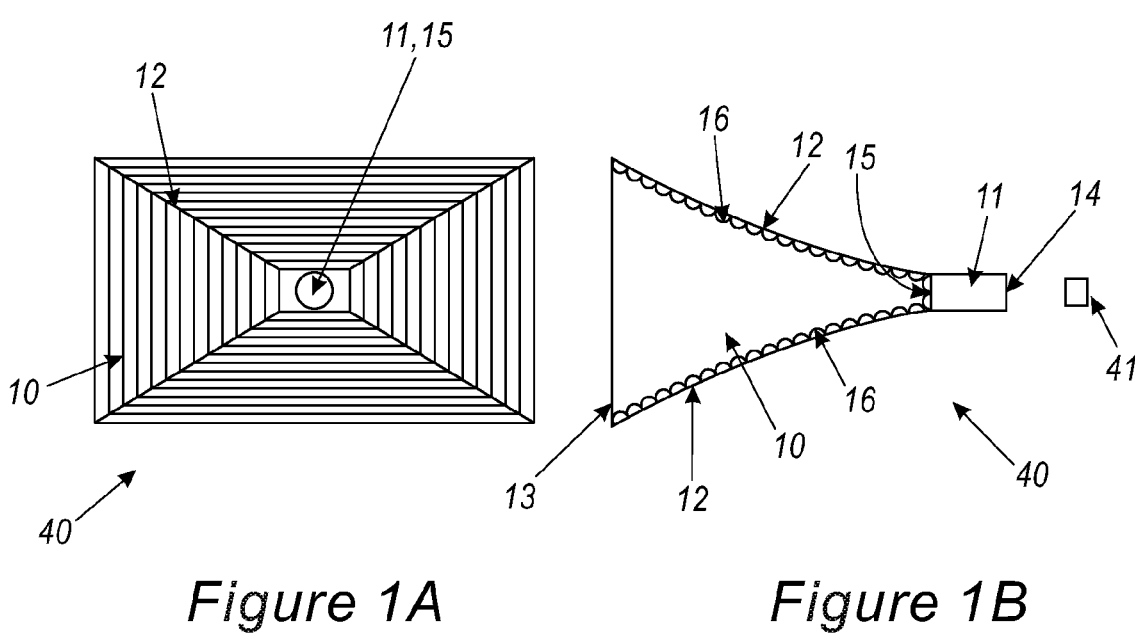
*Figure 1A*            *Figure 1B*
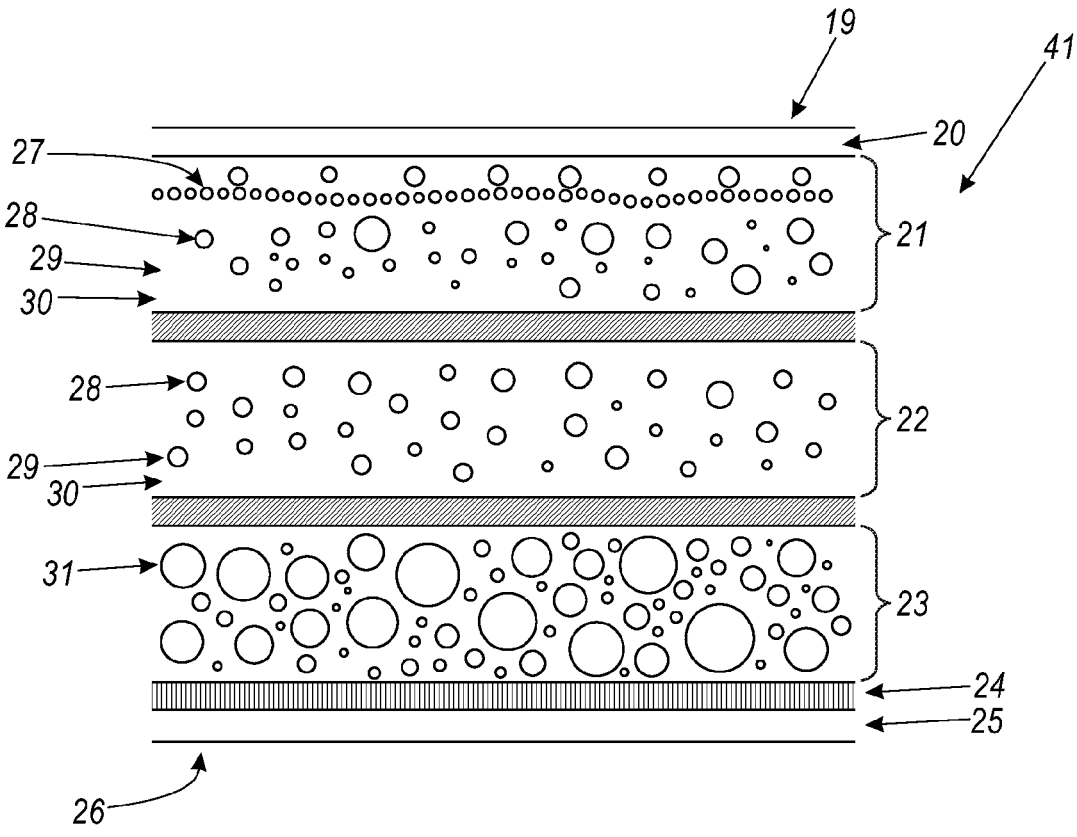
*Figure 2*

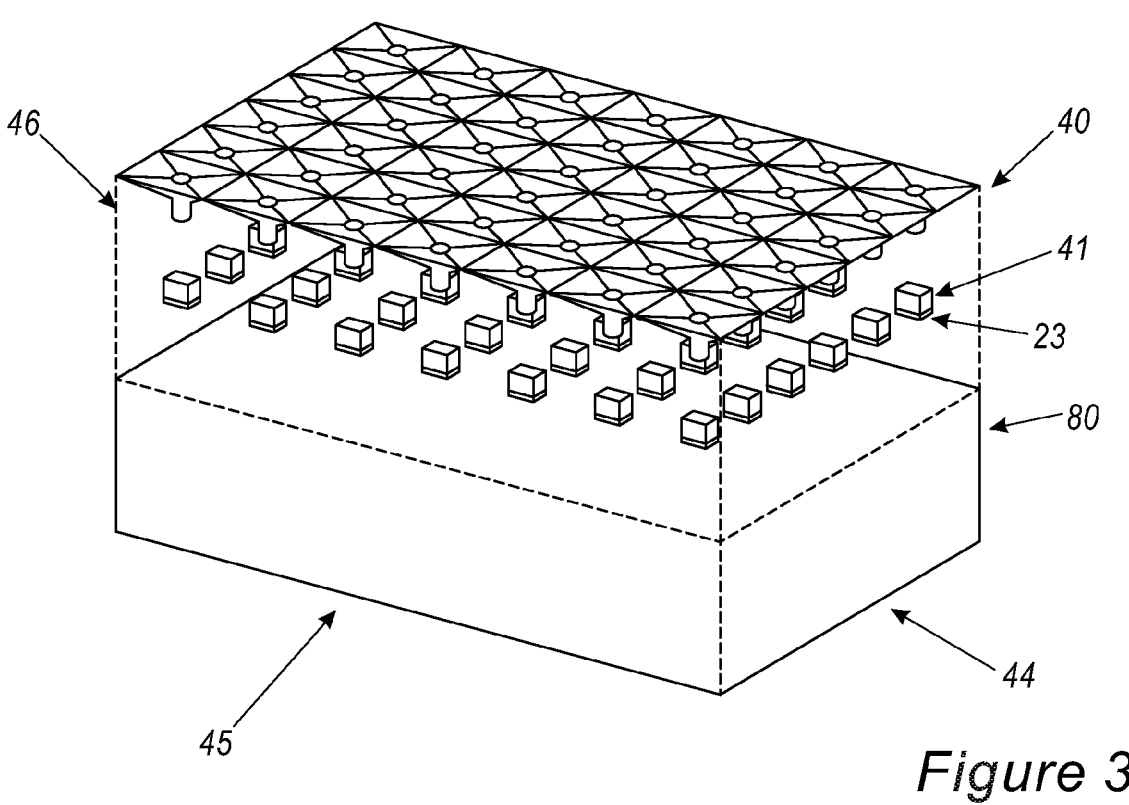
*Figure 3*
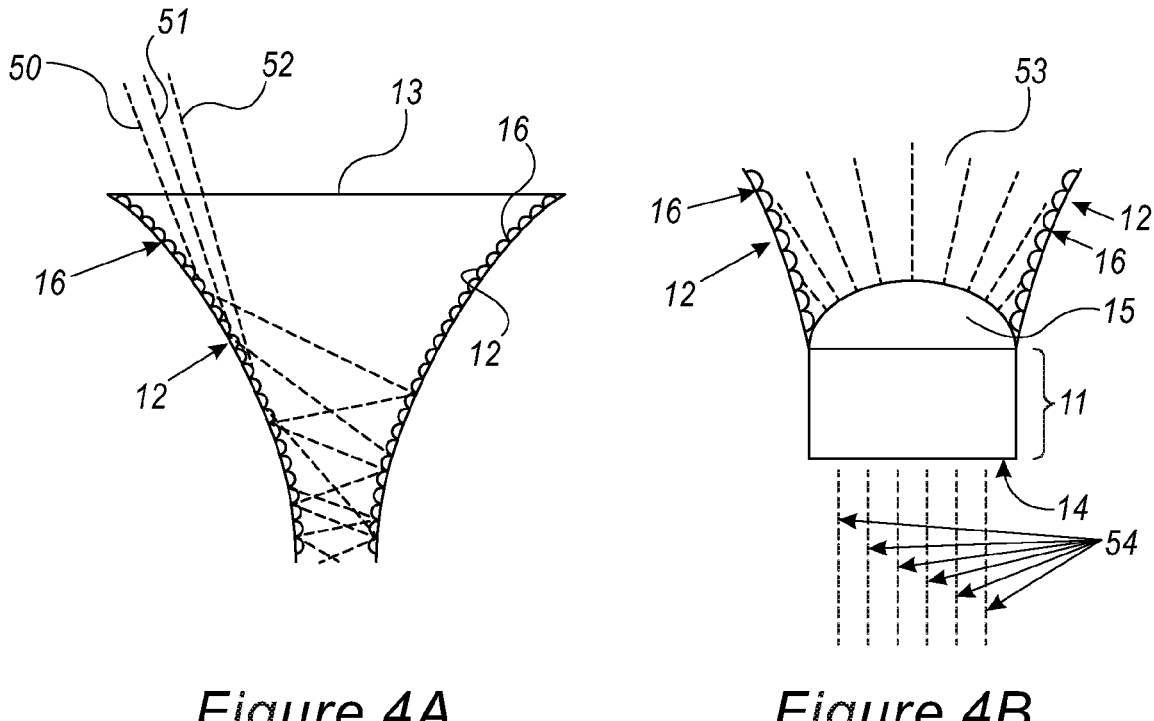
*Figure 4A*            *Figure 4B*

OPTICALLY CONCENTRATED THERMALLY STABILIZED PHOTOVOLTAIC SYSTEM AND METHOD

FIELD OF THE INVENTION

The present invention generally relates to solar energy generation, and in particular relates to the generation of electrical energy from assemblies containing photovoltaic cells.

BACKGROUND OF THE INVENTION

Leveraging the availability of solar light as a possible source of electrical energy has been an attractive route for individuals, companies, and governments for several decades. To this end, significant development in the field of solar energy has been made, utilizing several classes of technologies with which to convert solar light energy input into an electrical energy output. Among these classes of technologies is the class that contains photovoltaic cells comprising assemblies of materials that when combined in a particular format can exploit the photovoltaic effect, wherein light energy absorbed causes the excitation of an electron or other charge carrier such that either a voltage or an electric potential is generated between the absorbing material and an adjacent material, either of which can be employed in conjunction with particular circuitry to produce a current.

Both the materials used for photovoltaics, and the assemblies in which those materials are used, have been the subject of significant research and development, with photovoltaic cells typically achieving a maximum efficiency within the range of 20% to 25% (said photovoltaic efficiency relating to the rate of energy harvested to amount of radiation absorbed). This efficiency has allowed for the mass adoption of photovoltaic cells by a variety of users, although the ratio of price to energy efficiency continues to exclude many more users from the market. Producing an efficient photovoltaic assembly at a low and affordable price remains a key challenge in the field while further increasing photovoltaic cells' efficiency also remains to be desirous.

Because the direction from which any location on the planet receives solar light energy changes continuously throughout the day, users either have to install an additional means of controlling the position of a photovoltaic assembly, or install their photovoltaic assembly at a fixed angle and suffer non-optimal efficiencies for the vast majority of a photovoltaic assembly's operating lifetime. Addressing this position-control problem either drastically reduces efficiency, if left unaddressed, or increases cost as users employ other techniques. For instance, users may install a mechanical means of changing the assembly's angle over the course of a day whereby maintenance and liabilities to the risk of damage both become major long-term costs, further excluding users from the market.

To address these challenges, concentrator photovoltaic (CPVs) have been developed and disclosed, in which a photovoltaic assembly is supplemented with an additional feature capable of receiving light radiated upon a large area, and redirecting that light toward a smaller area, wherein the concentrated light subsequently irradiates the photovoltaic cell itself. Because a smaller area is required for a comparable amount of light energy, the volume of materials required for the photovoltaic cell itself is reduced, reducing price significantly. Furthermore, introducing an optical element into a photovoltaic assembly allows for the redirection of light from angles other to that which would otherwise be optimal for the photovoltaic cell at any one time, thus representing a feasible approach to solving the aforementioned position-control problem.

Light concentration, a function of an optical element in a photovoltaic assembly, is a general strategy for reducing the cost of materials in photovoltaic assemblies, utilizing the principles of reflection and refraction in order to redirect light toward a smaller photovoltaic cell. Given that a significant portion of the cost of construction for a photovoltaic assembly lies in the cost of the materials required for the photovoltaic cell itself, reducing the amount of photovoltaic material required has a very significant impact on the cost of the total assembly. Furthermore, optical components that provide light concentration functionality may also support light redirection from multiple incidence angles, such that users no longer need to either mechanically adjust the angle of their entire assembly or suffer sub-optimal performance due to control or adjustment limitations.

Many examples of CPVs have been disclosed in the art, including examples representative of the breadth of the field (WO/2020/128955 and U.S. Pat. No. 9,310,540) achieving a degree of light concentration and light redirection from a range of incidence angles through employment of a combination of substantially varying optical principles: the system and method taught in WO/2020/128955 uses parabolic reflection on a concave mirror surface to direct input light to a convex refractive surface that in turn redirects light toward a light guide via the principle of total internal reflection. Whilst the light concentration efficiency of this design is high, the complex shapes, arrangements, and material compositions of the components required, maintain a high cost. The system and method taught in U.S. Pat. No. 9,310,540 uses a convex inlet and concave outlet, utilizing the principles of in-coupled and out-coupled light in an internally reflective medium, further assisted by fluorescent organic dyes that can absorb electromagnetic energy frequencies outside the spectrum of visible light and re-emit frequencies within said spectrum.

Within the cell itself, producing functional nanocomposites with optimal photovoltaic capabilities remains another key challenge for this class of solar energy technologies. Various materials formed as nanorods, tetrapods, and other nanostructures, can be integrated into a matrix with other materials in order to generate a photovoltaic cell. However, during the fabrication process these nanostructures generally self-assemble into colloidal assemblages which greatly reduce the photovoltaic efficiency by drastically altering the optical and electrical properties of the resultant mass nanocomposite material in which they are integrated.

The practical process of solar energy generation is not a thermodynamically ideal process in the photovoltaic class of technologies, because a significant portion of light energy entering into the photovoltaic assembly is converted to heat. The thermal energy generated, and associated loss of efficiency, remains yet another key challenge for the industry, and a possible source of damage to many components within the photovoltaic assembly. Many perovskite materials in particular have non-favourable stability with exposure to normal levels of heat experienced by solar cells. Furthermore, the physical opto-electronic properties that allow for many photovoltaic assemblies to function are also properties which are in themselves temperature dependant, such that the efficiency and operability of these components is further reduced as their temperature increases.

SUMMARY OF THE INVENTION

The following embodiments and aspects thereof are described and illustrated in conjunction with systems, devices and methods which are meant to be exemplary and illustrative and not limiting in scope. In various embodiments, one or more of the above-described problems or drawbacks have been reduced or eliminated, while other embodiments are directed to other advantages or improvements.

According to one aspect, four components are assembled to produce the system comprising: a light concentrating funnel; a multilayer photovoltaic cell; a thermos-electric layer: and a thermal stabilization device, wherein each layer of the multilayer photovoltaic cell contains: semiconductor nanoparticles complexed with perovskite, an electrolyte, and a catalyst. The system assembly is arranged so as light can enter at a range of incidence angles at the light concentrating funnel, is directed and concentrated, then exits the light concentrating funnel and irradiates the multilayer photovoltaic cell where a voltage is generated, and the residual heat from these processes is stabilized with a thermal stabilization device.

In another aspect of the invention, the efficiency of the multilayer photovoltaic cell is improved by incorporating in its matrix cadmium selenide (CdSe) semiconductor nanoparticles (NPs) that have been modified to contain a single gold tip (Au), wherein the Au on one NP and the CdSe surface of another NP have a high selective chemical affinity for each other, and when in contact produce highly favorable optical and electronic properties for photovoltaic cells. The Au—CdSe interaction between different NPs produces an emergent property in the microstructure of the nanocomposite, such that the NPs will self-assemble in linear rods and chains rather than in colloidal structures, producing an overall effect of nanoparticle percolation through the matrix, in which nanoparticle contiguity is greatly improved, a microstructural property which imbues the photovoltaic nanocomposites with a far greater photovoltaic efficiency compared to colloidally self-assembled nanostructures.

The term 'percolation' as used herein refers to the extent to which the self-assembly of particles within a matrix produces physically contiguous connections across the dimensional limits of the matrix. In the context of conductive nanoparticles in a matrix, of which photovoltaic semiconductor nanorods for photovoltaic energy generation are a subset, the extent of percolation is proportional to the efficiency of the photovoltaic process because of both the increases to the conductivity of the overall composite and the increase in concentration of NP band gaps present in the composite. Another aspect of the invention is incorporating in the system a light concentrating funnel allowing for effective operation with multiple incidence angles and light concentration is. By directing light through a light concentrating funnel with optimal geometry for both concentration and redirection, the resultant photovoltaic assembly can be maintained at a fixed physical position and angle to the solar source. However, unlike conventional photovoltaic assemblies with fixed physical position and angles to their solar source, this invention allows for an additional 1.4 hours of operation each day, increasing the amount of power generated for each day. Furthermore, the light concentration functionality of the light concentrating funnel in this invention allows for a smaller amount of photovoltaic material to be required in order to generate the same amount of energy other known systems can produce, decreasing the cost of the total system.

According to another aspect of this invention, the light concentrating funnel contains at least one lens positioned between the lightguide and the solar source to aid in the redirection of collected light originating from a range of incidence angles to be redirected to parallel rays exiting the light concentrating funnel.

According to another aspect of the invention, the thermo-electric layer contains a means of thermo-electric energy generation deployed to convert the thermal energy generated by absorbance of non-utilized light energy to electrical energy within the total assembly. This means of thermo-electric energy generation may comprise: a powdered reductant compound, for example a lithium hydride powder; carbon nanotubes; and a small amount of uranium dioxide nanocrystals. This combination of materials can be adequately utilized to generate electrical energy from an input of thermal energy, and thus can be used to generate additional electrical energy derived from the thermal energy produced or otherwise present in the photovoltaic cell.

In order to maximize the amount of electrical energy generatable by the thermo-electric means, another aspect of the invention can also be employed. According to this aspect, vertically aligned carbon nanotubes (such as, but not limited to, VANTA BLACK type materials) on a layer of the photovoltaic cell furthest from the solar source absorb all remaining radiation, from a range of visible and non-visible frequencies, and convert said radiation to heat. This provides a further heat energy converted from light energy, which can be further converted to electrical energy by the thermos-electric means.

Typically, both the efficiency and capability of thermo-electric means used to convert heat energy to electrical energy become impaired as ambient temperature increases. To stabilize this temperature, and prevent said drops to efficiency and thermo-electric capability, the invention introduces another aspect: a means of thermal stabilization. For the photovoltaic application, a ductile polymeric body having an internal volume in which a refrigerant mixture is contained is optimal for stabilizing the temperature of the total system. The ductile body prevents the possibility of damage from mechanical stress likely to occur during transport and installation, whilst the refrigerant mixture provides a means of refrigeration without requiring the costs and risks involved in mechanisms that rely on moving parts. For example a combination of diphenyl ether (DE) and biphenyl (BP), having a ratio DE:BP in a range between 65:35 and 85:15, can provide for the likely temperatures in this application. By providing a means of thermal stabilization without an energy input, and doing so with a durable design capable of withstanding the mechanical distortions likely during transport, installation, and maintenance, this aspect of the invention can provide an optimal means of thermal stabilization for the application of solar energy generation.

BRIEF DESCRIPTION OF THE FIGURES

Some embodiments of the invention are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the invention.

In the Figures:

FIGS. 1a-1b constitutes a possible design for the light concentrating funnel component of the invention, FIG. 2 constitutes a schematic presentation of a two-layer variation of the multi-layer photovoltaic cell combined with a thermo-electric layer FIG. 3 illustrates by use of a vertically exploded diagram a single panel device.

FIGS. 4a-4b illustrate the effect of the light concentrating funnel with light emanating from a far away light source at a range of different incidence angles.

DETAILED DESCRIPTION OF SOME EMBODIMENTS

Figure 5A:
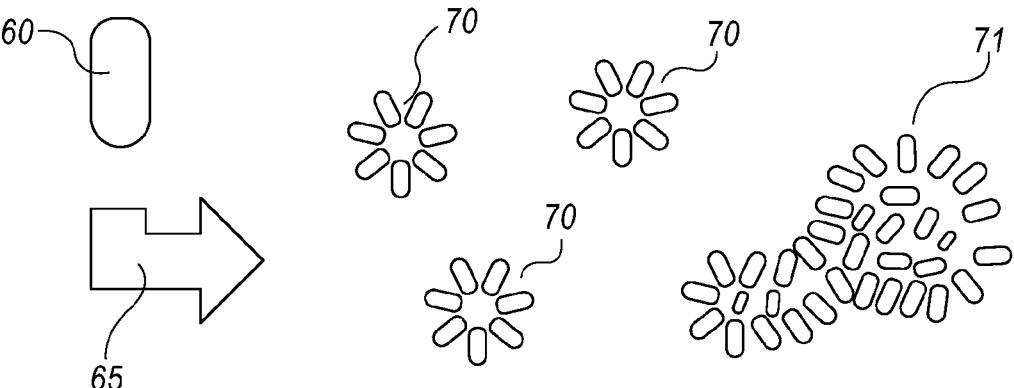
FIG. 5a demonstrates the self-assembly of semiconductor nanoparticles used in the prior art for photovoltaic applications.

In the following detailed description, numerous specific details are set forth in order to provide a thorough understanding of the invention. However, it will be understood by those skilled in the art that the present invention may be practiced without these specific details. In other instances, well-known methods, procedures, and components, modules, units and/or circuits have not been described in detail so as not to obscure the invention. Some features or elements described with respect to one embodiment may be combined with features or elements described with respect to other embodiments. For the sake of clarity, discussion of same or similar features or elements may not be repeated.

The present invention discloses a system and method of generating electrical power from an input of light energy by combining a light concentrating funnel component, a multilayer photovoltaic assembly, and a means of thermal stabilization. Typically the invention would apply to solar light though a person of the art would appreciate that it would be applicable also to other light and radiation sources.

According to some embodiments, the light concentrating funnel component is constructed from a reflective frame material containing an inlet face and a specific geometry designed to redirect light entering said inlet face from various incidence angles toward a lightguide component. According to some embodiments, this lightguide component includes a filter to remove several ranges of frequencies of incident light and electromagnetic wavelengths for which lower downstream photovoltaic efficiencies are not available or for which higher potential for damage to the downstream photovoltaic assembly is likely.

According to some embodiments, the aforementioned photovoltaic assembly having the aforementioned photovoltaic assembly is synonymous with the aforementioned multilayer photovoltaic assembly, and which typically includes at least two layers (while it is appreciated that multiple layers, typically more than two, may contribute to photovoltaic efficiency optimization), all of which containing: semiconductor nanoparticles complexed with perovskite; an electrolyte; and a catalyst. According to some embodiments, each layer of the multi-layered photovoltaic assembly is fabricated on a layer of silicon.

According to some embodiments, at least one of the layers of the multilayer photovoltaic assembly contains doped semi-conductor nanoparticles on which gold tips have been selectively grown on one side or tip. The optical coupling between the semi-conductor nanoparticle and the gold tip allos provides for highly favorable photovoltaic behavior. Furthermore, the anisotropy afforded to the composite gold-tipped nanoparticles can contribute to said composite materials self-assembling linearly in chains and rods which are also favorable for photovoltaic behavior of the total assembly. According to some embodiments, the semi-conductor nanoparticles on which gold tips are selectively and anisotropically grown are composed of cadmium selenide type materials.

According to some embodiments, the layer of the multi-layered photovoltaic assembly furthest from the solar light source contains a layer of vertically aligned nanotubes. These nanotubes are capable of absorbing more than 99.9% of the light not absorbed by the layers between them and the solar light source and can convert the energy contained therein to thermal energy. According to some embodiments, the layer of the multi-layered photovoltaic assembly furthest from the solar light source contains a highly electrically conductive material.

According to some embodiments, at least one layer of the multi-layered photovoltaic assembly contains a mixture of materials capable of converting thermal energy into electrical energy, and is henceforth referred to as the means of thermo-electric energy generation, and contains: a powdered reductant material; carbon nanotubes; and nanocrystals of uranium dioxide. The thermo-electric behavior of the uranium dioxide nanocrystals can be exploited by combining said nanocrystals with the aforementioned materials, to produce a sub-system of the disclosed invention capable of converting thermal energy into electrical energy.

According to some embodiments, the means of thermal stabilization is situated on the side of the multilayered photovoltaic cell furthest from the solar light source. According to some embodiments, the means of thermal stabilization comprises a ductile silicone or polymeric body having an internal volume containing a refrigerant mixture. According to some embodiments, said refrigerant mixture contains diphenyl ether (DE) and biphenyl (BP) having a volume: volume ratio DE:BP between 65:35 and 85:15. These two materials, when combined together in this range of ratios, can stabilize the temperatures experienced by the photovoltaic assembly to within temperature ranges at which photovoltaic efficiency is maintained above a favorable threshold, and at which damage to materials and physical arrangements thereof can be avoided.

According to some embodiments, many assemblies containing the multi-layered photovoltaic cell and light concentrating funnel are combined together laterally in a tessellating pattern. According to some embodiments, many assemblies containing the multi-layered photovoltaic cell and light concentrating funnel are situated with one or more means of thermal stabilization on the side of the said assemblies furthest from the solar light source. According to some embodiments, the complete assembly containing: the multi-layered photovoltaic cell; light concentrating funnel; and means of thermal stabilization, contains an additional translucent layer between the solar light source and the light concentrating funnel, which is capable of protecting the light concentrating funnel from damage or contamination by debris such as dust, sand, or organic material.

Reference is now made to FIG. 1, which illustrates a design for the light concentrating funnel component comprising the photovoltaic assembly.

FIG. 1a shows a vertical view of the light concentrating funnel in which the frame 10 is visible through the inlet face 13, leading down to the lightguide 11 sub-component. Light from the solar source is collected at various incidence angles through the inlet face 13 and is directed through the frame 10 towards the lightguide 11. FIG. 1b illustrates a lateral cross-sectional view of the light concentrating funnel, in which the specific geometry 12 of the frame 10 is visible. Geometry 12 presents tapering oblique funnel walls which may be of a curved or otherwise light reflecting shape and composed of a highly reflective material surface 16. Light entering the inlet face 13 through the frame 10 is directed by the specific geometry 12 towards the lens 15 and then to the light guide 11, wherein it is further directed out of the light concentrating funnel assembly through the exit face 14 toward multi-layered photovoltaic cell 15. In FIG. 1*b*, the specific geometry 12 of the frame 10 is demonstrated, including a specific curvature allowing for the optimal redirection of light from various incidence angles, affording the total assembly improved efficiency by increasing the amount of active time per day without the need for a separate assembly for modifying the incidence angle.

Reference is now made to FIG. 2, which illustrates by way of example a view of an embodiment of the multi-layered photovoltaic cell 15 containing two layers combined with a thermoelectric layer. According to some embodiments, amount of said layers can be increased in accordance with photovoltaic efficiency optimization considerations. Light enters from the side of the multi-layered photovoltaic cell closest to the solar light source 19 and through a translucent layer 20 of light and radiation conductive material such as pigment integrated glass or other photon and heat conducive means, before travelling through the first layer 21, then the second layer 22, then the thermoelectric layer 23, before reaching a final layer 24 containing vertically aligned nanotubes and transparent conductive oxide. Between each of the silicon layers 21, 22, and 23, separations 27 exist with no spatial or material margin. An additional layer of glass 25 protects the side of the multi-layered photovoltaic cell furthest from the solar light source 26. Each of the layers 21 and 22 contains semiconductor nanoparticles complexed with perovskite 28; an electrolyte 29; and a catalyst 30. In layers 21 or 22, nanocrystals tipped with gold 61 are also optionally integrated. In the thermoelectric layer 23 a combination of materials 31 is integrated that provide a means of thermoelectric energy generation.

The photovoltaic efficiency of the system and method suggested herein can be calculated as the percentage of energy contained within photons of light exiting the light concentrating funnel through exit face 14, which may be converted to electrical energy directly with the use of the multi-layered photovoltaic assembly, or converted first to thermal energy and then to thermos-electric energy by the means of thermo-electric energy generation within the thermos-electric layer.

According to some embodiments, the combination of: semiconductor nanoparticles complexed with perovskite 28; an electrolyte 29; and a catalyst 30, typically provides a photovoltaic efficiency between 19% and 24%, whilst the addition of nanocrystals tipped with gold 27 in at least one of layers 21 or 22 provides an additional 6-10% photovoltaic efficiency. According to some embodiments, some of the energy contained in photons entering the multi-layered photovoltaic assembly from the exit face 14 of the light concentrating funnel is converted to heat within the layers 20, 21, 22, and 23, and especially by the vertically aligned carbon nanotubes in layer 24, principally by irradiative heat transfer. According to some embodiments, this heat energy can be partially converted to electrical energy by the means of thermo-electric energy generation 31 in the thermoelectric layer 23.

Reference is now made to FIG. 3, which illustrates by use of a vertically exploded diagram a plurality of light concentrating funnels combined with a plurality of multi-layered photovoltaic cells and with a plurality of thermo-electric layers with a means of thermal stabilization into a single panel device. The total assembly of components outlined in FIG. 3 has limited geometry longitudinally 45 and laterally 44 and is displayed in exploded form along vertical direction 46. A plurality of light concentrating funnels 40 is arranged in a tessellating pattern that ensures all light reaching the face 13 of the light concentrating funnel, is redirected through the light concentrating funnels' light guide 11, to the exit face 14 of said light concentrating funnels. The redirected and concentrated light now irradiates the plurality of multilayer photovoltaic cells 41, which are geometrically arranged directly within the beam of light exiting the exit faces 14 of the light concentrating funnel. Because of the actions of the light concentrating funnel, the required area for photovoltaic operation is significantly reduced, allowing for smaller photovoltaic assemblies using fewer materials and incurring smaller cost. Additionally, the higher concentration of light energy contained within the light exiting the exit faces 14 of the light concentrating funnel compared to the input light from the solar source means that, for many photovoltaic materials and in particular the specific combination outlined in the disclosed invention, the portion of the photovoltaic efficiency originating from direct conversion of light energy to electrical energy is significantly higher for the concentrated light than it would be for the input light from the solar source. In the embodiment illustrated in FIG. 3, the thermoelectric layers 23 are directly juxtaposed with the multilayered photovoltaic assembly 15 layers' 21 and 22, in order to absorb and convert as much light and heat energy as possible.

According to some embodiments, a means of thermal stabilization 43 is vertically aligned with the rest of the components and contains holes 83 arranged to vertically align with the assemblages of light concentrating funnels 40, multilayer photovoltaic cells 41 and thermoelectric layers 23. According to some embodiments, a panel system containing a plurality of light concentrating funnels 40 and a plurality of multilayer photovoltaic cells 41 containing a plurality of thermoelectric layers 23 may have a single means of thermal stabilization 43 providing thermal stabilization function. According to some embodiments, the at least one means of thermal stabilization 43 may be configured to contain holes in which the assemblages of a multilayer photovoltaic cell 41 and a thermoelectric layer 23 are housed within. According to some embodiments, the at least one means of thermal stabilization 43 may be configured to contain holes in which the assemblages of a light concentrating funnel 40 and a multilayer photovoltaic cell 41 and a thermoelectric layer 23 are housed within.

Reference is now drawn to FIG. 4, which illustrates the effect of the light concentrating funnel with light emanating from a far away light source, such as a solar light source, at a range of different incidence angles. In FIG. 4*a*, a partial cross section view of a single light concentrating funnel is presented, displaying the inlet face 13 and the geometry 12. Locationally distinct exemplary light rays from the same incidence angle: 50, 51, and 52, are displayed entering the inlet face 13. By exploiting the reflections of these rays through the specific geometry 12 and reflective surface 16, the exemplary three light rays: 50, 51, and 52, can all be uniformly directed to the bottom of the of the light concentrating funnel. FIG. 4*b* constitutes the lower section of the light concentrating funnel, containing a lens 15 and light-guide 11, wherein light from a range of incidence angles 53 arrives at the lens 15, and is redirected thereby to with the lightguide 11, and then exits the exit face 14 having been redirected into parallel rays 54. Such arrangement mitigates the variance of incidence angles of light from the solar source entering the photovoltaic assembly change throughout the day and through the year which otherwise limit operating times per day even when there are no obstructing factors such as dust, mist, or clouds. According to some embodiments, the design of a light concentrating funnel as presented in FIG. 4 provides between 60 and 100 minutes of additional operating time for every day of operation, without any requirement to physically redirect the photovoltaic assembly itself.

Figure 5B:
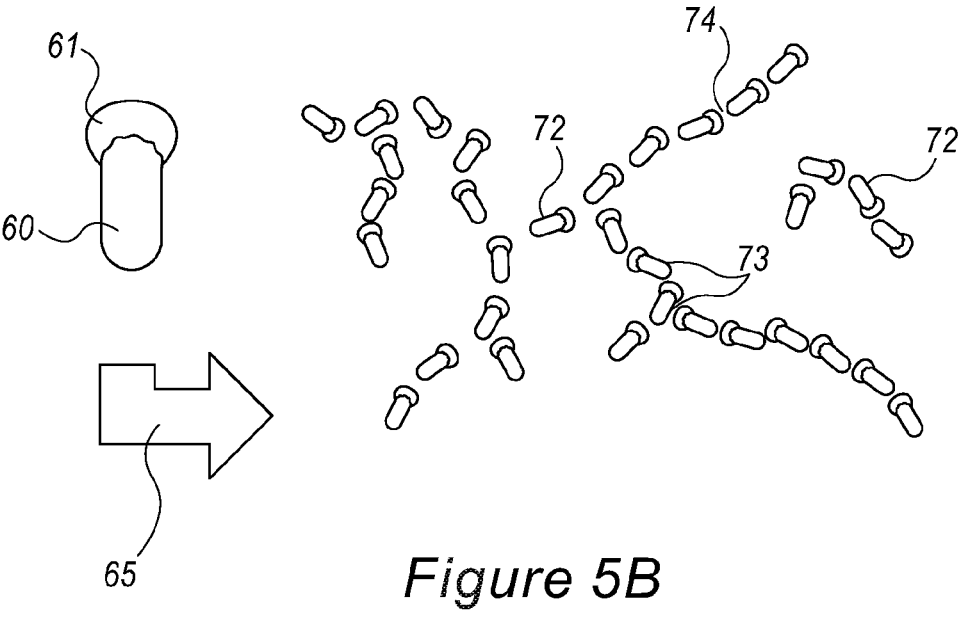
FIG. 5b demonstrates the self-assembly of gold tipped semiconductor nanoparticles as used in the disclosed invention FIG. 6a constitutes a top-down view of the means of thermal stabilization FIG. 6b constitutes a 3-dimensional diagram with diagonal cross section of the means of thermal stabilization.

Reference is now drawn to FIG. 5a and to FIG. 5b, which demonstrate the self-assembly of semiconductor nanoparticles used in the prior art for photovoltaic applications, and the self-assembly of gold tipped semiconductor nanoparticles as used in the disclosed invention, respectively. In the conventional case illustrated in FIG. 5a, semiconductor nanorods 60 proceed through a self-assembly process 65 wherein they self-assemble to form colloids 70 and agglomerations thereof 71, displaying insignificant percolation that leads to poor photovoltaic efficiency. In the case presented in the disclosed invention and illustrated in FIG. 5b, the semiconductor nanorods 60 are modified to contain a gold tip 61 on one end, such that after the self-assembly process 65 mostly linearly arranged arrangements 72 of gold tipped nanorods are formed, having many dual connections 74 and multiple connections 73, producing a composite with significantly improved percolation over the embodiment illustrated in FIG. 5a and thus significantly improved photovoltaic efficiency. According to some embodiments, the semiconductor nanorods used in the disclosed invention are composed of CdSe wherein the band gap produced at the junction between the gold and the semiconductor is highly favorable for photovoltaic energy generation using concentrated light.

Figure 6A:
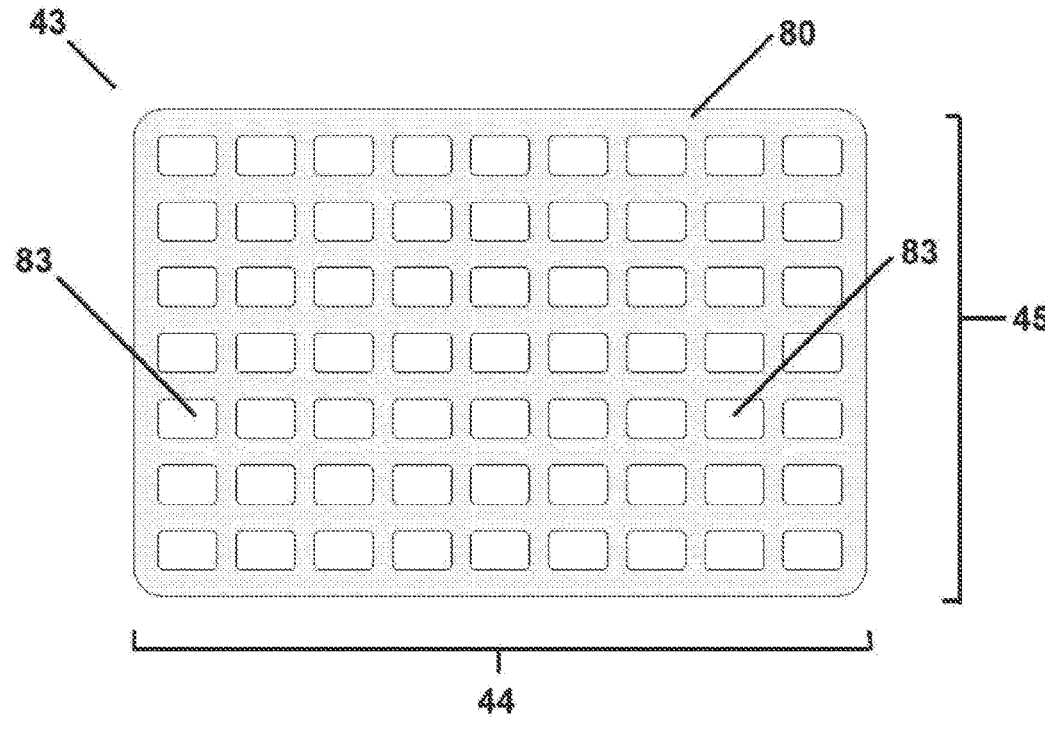

Reference is made to FIG. 6a which constitutes a top-down view of the means of thermal stabilization 43. A ductile polymeric body 80 is employed to contain a refrigerant mixture formulated for stabilizing the temperature of the total system. Holes 83 through the body 80 of the means of thermal stabilization 43 are arranged so as to contain the photovoltaic cells 41 and thermo-electric layers 23. The means of thermal stabilization 43 illustrated in FIG. 6a is arranged to contain within its' holes 83 assemblages of photovoltaic cells 41 and thermo-electric layers 23 along its lateral dimension 44 and 7 such assemblages along its longitudinal dimension 45, according to some embodiments the number of such assemblages contained in either dimension is at least one and not otherwise limited in number.

Figure 6B:
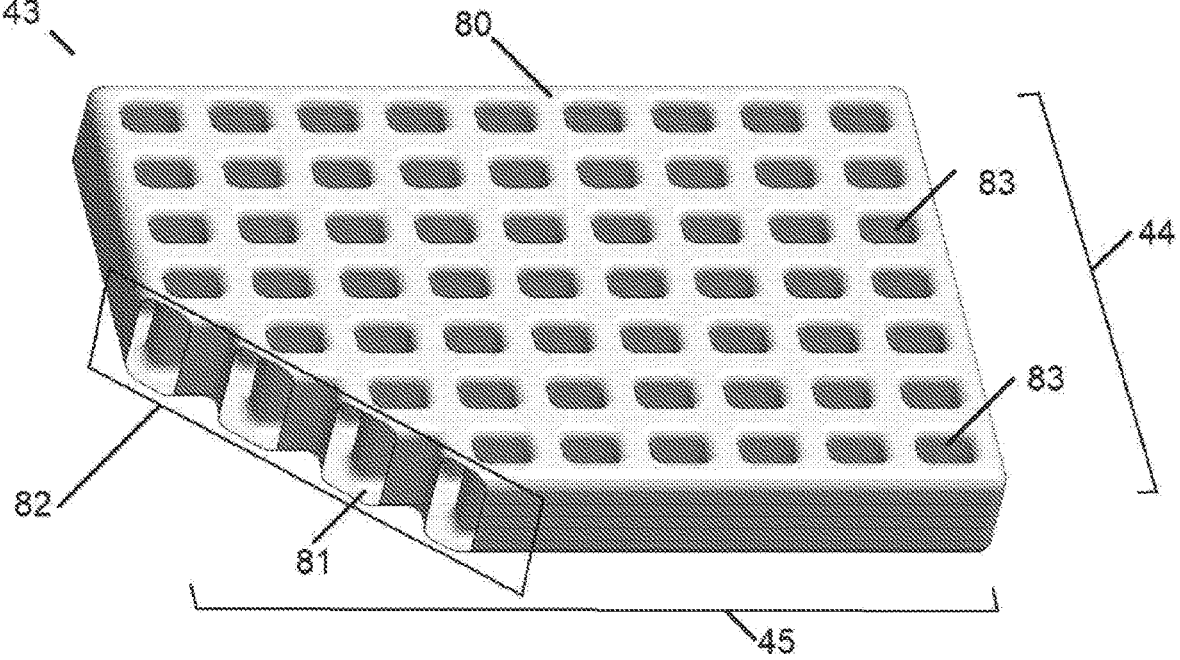

Reference is made to FIG. 6b which constitutes a 3-dimensional diagram with diagonal cross section of the means of thermal stabilization 43. A ductile polymeric body 80 having an internal volume 81 is employed to contain a refrigerant mixture formulated to be optimal for stabilizing the temperature of the total system. A diagonal cross section 82 is provided to illustrate the internal volume 81. Holes 83 through the body 80 of the means of thermal stabilization 43 are arranged so as to contain the photovoltaic cells 41 and thermo-electric layers 23. The means of thermal stabilization 43 illustrated in FIG. 6b is arranged to contain within its' holes 83 assemblages of photovoltaic cells 41 and thermo-electric layers 23 along its lateral dimension 44 and 7 such assemblages along its longitudinal dimension 45, according to some embodiments the number of such assemblages contained in either dimension is at least one and not otherwise limited in number. According to some embodiments, the geometric profile of each hole 83 through the body 80 of the thermal stabilization device 43 allows for perfect tessellation with the underside of the frame 10 of the light concentrating funnel 40. The ductile body 80 prevents the possibility of damage from mechanical stress likely to occur during transport and installation, whilst the refrigerant mixture provides a means of refrigeration without requiring the costs and risks involved in mechanisms that rely on moving parts.

According to some embodiments, a combination of diphenyl ether (DE) and biphenyl (BP), having a ratio DE:BP in a range between 65:35 and 85:15, can provide a means of refrigeration for the likely temperatures in this application when contained in the internal volume 81 of the ductile polymeric body 80 of the means of thermal stabilization 43.

Although the present invention has been described with reference to specific embodiments, this description is not meant to be construed in a limited sense. Various modifications of the disclosed embodiments, as well as alternative embodiments of the invention will become apparent to persons skilled in the art upon reference to the description of the invention. It is, therefore, contemplated that the appended claims will cover such modifications that fall within the scope of the invention.

The invention claimed is:

1. A system for the conversion of light energy to electrical energy, comprising:
   a light source;
   a protective transparent layer;
   a light concentrating funnel;
   a multi-layer photovoltaic cell, and a means of thermal stabilization, wherein each of the layers in the multi-layer photovoltaic cell contains semiconductor nanoparticles complexed with perovskite;
   a translucent electrolyte;
   a catalyst of p/n-type configuration opposed to that of the perovskite and
   at least one thermo-electric layer containing a means of thermo-electric energy generation.

2. The system of claim 1 wherein the light concentrating funnel comprises an inlet enclosed by walls that taper toward a central cylindrical outlet lightguide.

3. The system of claim 2, wherein the concentrating funnel walls are shaped in light reflective shapes.

4. The system of claim 2, wherein the central cylindrical outlet lightguide includes a filter to remove several ranges of electromagnetic wavelengths.

5. The system of claim 2, wherein the central cylindrical outlet lightguide includes a filter to remove several ranges of frequencies of incident light.

6. The system of claim 2, wherein the inlet is enclosed by a translucent layer in which a pigment is integrated whereby distribution of wavelengths of light and radiation are filtered.

7. The system of claim 1, wherein the layer of the multi-layer photovoltaic cell furthest from the light source contains transparent conductive oxide and vertically aligned carbon nanotubes configured to absorb the remaining energy contained in light from the light source.

8. The system of claim 1, wherein at least one of the layers of the multi-layer photovoltaic assembly contains semiconductor nanoparticles containing gold tips selectively grown on one side.

9. The system of claim 7, wherein the at least one thermo-electric layer is the layer adjacent to the vertically aligned carbon nanotubes, and wherein the means of thermo-electric generation contained therein itself contains:

a reductant compound material in powdered form; carbon nanotubes; and nanocrystals of Uranium Dioxide.

10. The system of claim 1, wherein the means of thermal stabilization consists of a ductile polymeric body having an internal volume containing a refrigerant mixture composed of diphenyl ether (DE) and biphenyl (BP) in a ratio DE: BP having a range between 65:35 and 85:15.

11. The system of claim 10, wherein ductile body is of silicone.

12. An arrangement in a tessellating pattern of a plurality of systems according to claim 1.

13. A method of converting light energy to electrical energy using the system as recited in claim 1, comprising the steps of:

(i) receiving light rays at various incidence angles relative to a light concentrating funnel, (ii) concentrating said light rays through said light concentrating funnel, (iii) converting the energy contained in said light rays to electrical energy with the use of a multi-layer photovoltaic cell, (iv) converting thermal energy to electrical energy with the at least one thermo-electric layer containing the means of thermos-electric energy generation;

(v) stabilizing the temperature increase produced by steps (i)-(iii) by absorbing thermal energy in a refrigerant mixture contained within a ductile silicone or polymeric body.

14. The method of claim 13, wherein the multi-layer photovoltaic cell comprises a layer furthest from the light source containing transparent conductive oxide and vertically aligned carbon nanotubes.

15. The method of claim 13, wherein thermal energy produced in steps (i)-(iii) is partially converted to electric energy by use of the means of thermo-electric energy generation within the layer of the multilayer photovoltaic cell.

*    *    *    *    *